United States Patent [19]
Ono

[11] Patent Number: 5,965,918
[45] Date of Patent: Oct. 12, 1999

[54] SEMICONDUCTOR DEVICE INCLUDING FIELD EFFECT TRANSISTOR

[75] Inventor: Mizuki Ono, Yokohama, Japan

[73] Assignee: Kabushiki Kaisha Toshiba, Kawasaki, Japan

[21] Appl. No.: 09/271,168

[22] Filed: Mar. 18, 1999

[30] Foreign Application Priority Data

Mar. 19, 1998 [JP] Japan .................................. 10-070886

[51] Int. Cl.$^6$ ............................ H01L 27/01; H01L 23/58
[52] U.S. Cl. ......................... 257/347; 257/638; 257/645; 257/651
[58] Field of Search ................................... 257/347, 349, 257/410, 638, 645, 651

[56] References Cited

U.S. PATENT DOCUMENTS

| | | | |
|---|---|---|---|
| 4,282,543 | 8/1981 | Ihara et al. | |
| 5,191,397 | 3/1993 | Yoshida | 257/347 |
| 5,866,932 | 2/1999 | Yamazaki et al. | 257/347 |

FOREIGN PATENT DOCUMENTS

| | | |
|---|---|---|
| 5-259418 | 10/1993 | Japan . |
| 6-13593 | 1/1994 | Japan . |

OTHER PUBLICATIONS

H. Miyajima et al., "Water Absorption Properties of Flurine–Doped $SiO_2$ Films Using Plasma–Enhanced Chemical Vapor Deposition", Jpn. J. Appl. Phys. vol. 35, part 1, No. 12A, pp. 6217–6225 (1996).

A. Nara et al., "Low Dielectric Constant Insulator by Downstream Plasma CVD at Room Temperature Using Si $(CH_3)_4/O_2$", Extended Abstracts of the 1996 International Conference on Solid State Devices and Materials, pp. 815–817, (1996).

S. Polchlopek et al., "Properties of Nitrogen–Implanted SOI Substrates", IEEE Transactions on Electron Devices, 40 (2):385–391 (1993).

G. Virdi et al., "Effect of Flurine–ion Implantation on Buried Nitride Silicon–on–Insulator Structures", Appl. Phys. Lett., 60(4):492–494, (1992).

M. Bruel et al., "Smart Cut": A Promising New SOI Material Technology, Proceedings 1995 IEEE Internaitonal SOI Conference, pp. 178–179, (1995).

Takagi et al., "Mobility Enhancement of SOI MOSFETS Due to Subband Modulaiton in Ultra–Thin SOI Films", Extended Abstracts of the 1997 International Conference on Solid State Devices and Materials, pp. 154–155, (1997).

Primary Examiner—Ngân V. Ngô
Attorney, Agent, or Firm—Finnegan, Henderson, Farabow, Garrett & Dunner, L.L.P.

[57] ABSTRACT

An insulating film having a low dielectric constant lower than that of silicon oxide is arranged between a silicon support layer and a silicon active layer. A channel region, source/drain regions, and a device isolation region are formed in the active layer. A gate electrode is arranged on the channel region through a gate insulating film. The active layer is covered with a TEOS film in which contact holes are formed. The contact holes are filled with wiring layers connected to the source/drain regions and the gate electrode.

19 Claims, 10 Drawing Sheets

SEMICONDUCTOR DEVICE INCLUDING FIELD EFFECT TRANSISTOR

BACKGROUND OF THE INVENTION

The present invention relates to a semiconductor device including a field effect transistor arranged on an SOI (Silicon On Insulator) wafer, i.e., an SOI transistor.

In order to increase the operation speed of a semiconductor device, an SOI wafer, which allows parasitic capacitance in the semiconductor device to decrease, is used in place of a single-crystalline Si wafer. Generally, the SOI wafer, i.e., a wafer having an SOI structure, includes a buried insulating layer consisting of silicon oxide and having properties, such as dielectric constant, uniform all over the wafer.

One of factors which characterizes the properties of a field effect transistor is an S-factor. The S-factor is defined as the amount of change in gate voltage, which is necessary for changing drain current by one digit, within a range where the gate voltage is not more than a threshold voltage. It is known that a value of the S-factor is provided by the following theoretical formula (1).

$$kT/q \times \log_e 10 \times (1 + C_{para}/C_G) \quad (1)$$

where k is Boltzmann's constant, T is an absolute temperature, q is an absolute value of electric charge of electrons, e is the base of a natural logarithm, $C_G$ is a capacitance formed between the channel and gate, $C_{para}$ is a capacitance formed between the channel and a portion other than the gate.

The lower limit of the S-factor at room temperature, i.e., 300K, is about 60 mV/dec. The denominator of this dimension, i.e., "dec", means that a shown value is a value necessary for increasing the current by one digit.

Where the value of the S-factor becomes larger, a change in gate voltage necessary for causing a change in current by a certain degree grows larger. In this case, in order for the current in an OFF-state to be small, a high threshold voltage has to be set, thereby causing the voltage of a supply voltage to be high.

Where an SOI transistor is of a complete depletion type having a sufficiently long channel length, the $C_{para}$ is mainly occupied by the capacitance between the channel and the substrate. With an increase in thickness of the buried insulating layer, the $C_{para}$ decreases to make the S-factor small. Accordingly, in an extreme case where the buried insulating layer has an infinitely large thickness, the S-factor converges onto the theoretical lower limit.

On the other hand, where the channel length becomes shorter along with the semiconductor device being smaller, the S-factor comes to converge onto a value greater than the theoretical lower limit, even if the buried insulating layer grows thicker. If the S-factor cannot be smaller, the power supply voltage inevitably has to be high, thereby increasing the power consumption of the semiconductor device.

BRIEF SUMMARY OF THE INVENTION

An object of the present invention is to provide a semiconductor device which can make the S-factor of a field effect transistor small, thereby reducing the power consumption of the semiconductor device.

According to a first aspect of the present invention, there is provided a semiconductor device including a field effect transistor, comprising:

a support layer consisting essentially of silicon;

a buried insulating layer arranged on the support layer;

an active layer consisting essentially of silicon and arranged on the buried insulating layer, the buried insulating layer being interposed between the support layer and the active layer;

source/drain regions and a channel region interposed therebetween, which are formed in the active layer to be in contact with the buried insulating layer;

a gate electrode facing the channel region through an insulating film; and source/drain electrodes connected to the source/drain regions, respectively, wherein the buried insulating layer comprises a low-dielectric-constant region having a dielectric constant of from 1 to 3.9, along a route of lines of electric force extending from the channel region to each of the source/drain regions through the buried insulating layer to form a capacitive coupling between the channel region and each of the source/drain regions.

According to a second aspect of the present invention, there is provided a semiconductor device including a field effect transistor, comprising:

a support layer consisting essentially of silicon;

a buried insulating layer arranged on the support layer and comprising a low-dielectric-constant region having a dielectric constant of from 1 to 3.9;

an active layer consisting essentially of silicon and arranged on the buried insulating layer, the buried insulating layer being interposed between the support layer and the active layer;

source/drain regions and a channel region interposed therebetween, which are formed in the active layer to be in contact with the buried insulating layer, the source/drain regions facing the low-dielectric-constant region;

a gate electrode facing the channel region through an insulating film; and source/drain electrodes connected to the source/drain regions, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In a process of developing the present invention, the present inventor conducted research on the subject as to why the S-factor comes to converge onto a value greater than the theoretical lower limit, even if the buried insulating layer grows thicker, where the channel length becomes shorter. Through the researches, the present inventor has obtained the following findings.

The following is the above described theoretical formula (1), by which a value of the S-factor is provided.

$$kT/q \times \log_e 10 \times (1 + C_{para}/C_G) \quad (1)$$

where k is Boltzmann's constant, T is an absolute temperature, q is an absolute value of electric charge of electrons, e is the base of a natural logarithm, $C_G$ is a capacitance formed between the channel and gate, $C_{para}$ is a capacitance formed between the channel and a portion other than the gate.

Where a semiconductor has a sufficiently long channel length, the $C_{para}$ in the theoretical formula (1) is mainly occupied by the capacitance between the channel and the substrate. However, as the channel length decreases, a capacitance, which is formed by coupling the channel with the source and drain by lines of electric force EF (see FIG. 2) from the channel through the buried insulating layer, increasingly contributes to the $C_{para}$. Consequently, in this case, the value of the S-factor becomes greater than the theoretical lower limit, due to the $C_{para}$ including this contribution, at an infinitely large thickness of the buried insulating layer.

For the above reason, as the channel length decreases, the S-factor comes to converge onto a value greater than the theoretical lower limit, even if the buried insulating layer has an infinitely large thickness. If the S-factor cannot be smaller, the power supply voltage inevitably has to be high, thereby increasing the power consumption of the semiconductor device.

Judging from the theoretical formula (1), there are considered two methods for making the S-factor smaller, i.e., a first method in which at least a part of the buried insulating layer under the channel is formed of a material having a low dielectric constant, and a second method in which the $C_G$ in the formula (1) is increased.

The second method is realized by making the gate and the channel closer, and thus can be achieved by reducing the thickness of the single-crystalline silicon layer on the buried insulating layer. However, it is pointed out that as the thickness of the single-crystalline silicon layer is reduced, the mobility of carriers decrease (by S. Takagi et al.; Ext. Abs. of the 1997 International Conference on Solid State Devices and Materials, pp. 154–155). In this case, therefore, the driving property of the semiconductor device is deteriorated. Accordingly, it is not preferable to solve the above described problem on the S-factor by the second method, because another problem is caused.

On the other hand, in the first method, the S-factor can be smaller without causing another problem, by changing part of the buried insulating layer to a material having a dielectric constant lower than that of silicon oxide.

Figure 3:
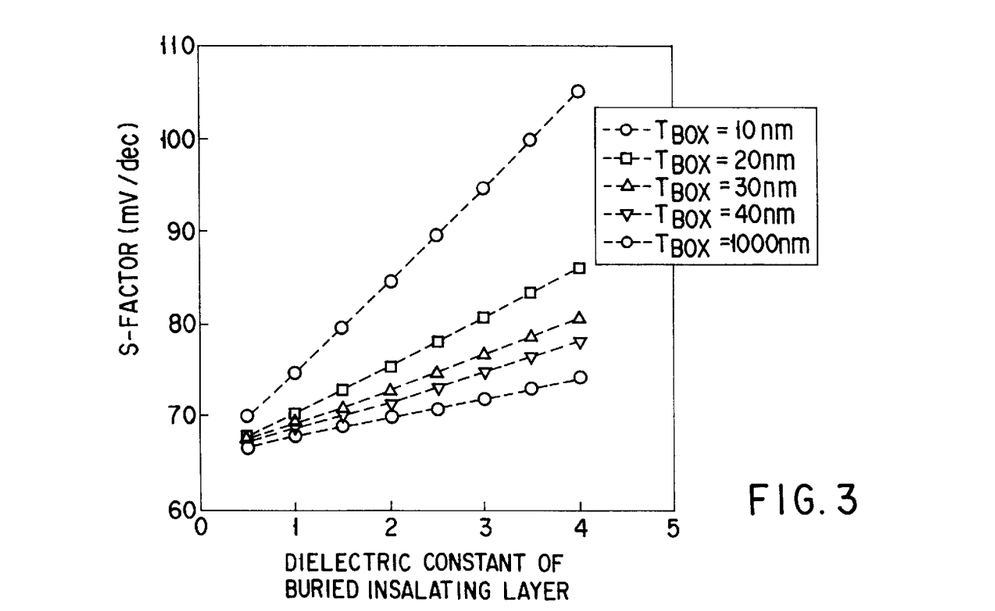
FIG. 3 is a graph showing a dependency characteristic of the S-factor on the dielectric constant of a buried insulating layer.

FIG. 3 is a graph showing a dependency characteristic of the S-factor on the dielectric constant of a buried insulating layer, in which the thickness of the buried insulating layer $T_{BOX}$ is used as a parameter. FIG. 3 shows results when the gate length was set at 100 nm. As shown in FIG. 3, it is effective for making the S-factor smaller to reduce the dielectric constant of the buried insulating layer.

In this case, the decrease in the S-factor is provided by the following fact. Specifically, in FIG. 2, for example, the buried insulating layer 12 has a lower dielectric constant along the route of the lines of electric force EF extending from a channel region 51 to each of the source/drain regions 52 through the buried insulating layer 12 to form a capacitive coupling between the channel region 51 and each of the source/drain regions 52. Accordingly, there is no need to lower the dielectric constant of the buried insulating layer 12 as a whole, but it suffices if the buried insulating layer 12 has a region of low dielectric constant along the route of the lines of electric force EF.

The dielectric constant of the low-dielectri-cconstant region has to be lower than that of silicon oxide film. The low-dielectric-constant region is formed of a solid region consisting essentially of, e.g., silicon oxide doped with fluorine, silicon oxide doped with carbon, or SOG; or formed of a hollow region, such as a gap which is a vacuum or filled with an inactive or inert gas. Accordingly, the dielectric constant of the low-dielectric-constant region has a set range of from 1 to 3.9. Where the low-dielectric-constant region is formed of a solid region, the dielectric constant of the low-dielectric-constant region has a set range of from 2 to 3.9, in light of properties of presently available materials.

For example, where the low-dielectric-constant region consists essentially of silicon oxide doped with fluorine, the concentration of the fluorine is set to be more than zero and not more than 12 atm %, and preferably from 6 to 12 atm %. If the concentration of the fluorine is more than 12 atm %, the hygroscopic property of the film greatly increases. On the other hand, if the concentration of the fluorine is less than 6 atm %, the hygroscopic property of the film also increases.

Where the low-dielectric-constant region consists essentially of silicon oxide doped with carbon, the concentration of the carbon is set to be more than zero and not more than 2.9 times larger than the density of Si atoms in the low-dielectric-constant region, and preferably from 2.6 to 2.9 times larger than the density of Si atoms. If the concentration of the fluorine is more than 2.9 times larger than the density of Si atoms, the dielectric constant of the film becomes 3.9 or more, and the coverage property of the film is deteriorated. On the other hand, if the concentration of the fluorine is less than 2.6 times larger than the density of Si atoms, the growth rate of the film becomes lower, though the dielectric constant does not change so much as compared to that in the preferable range.

Figure 4A:
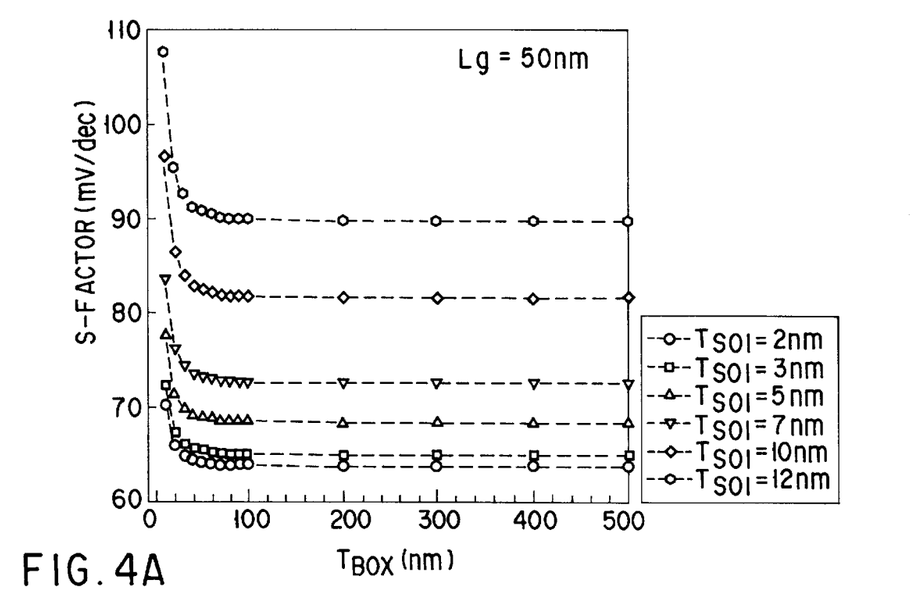
FIGS. 4A and 4B are graphs each showing a dependency characteristic of the S-factor on the thickness of a buried insulating layer.
Figure 4B:
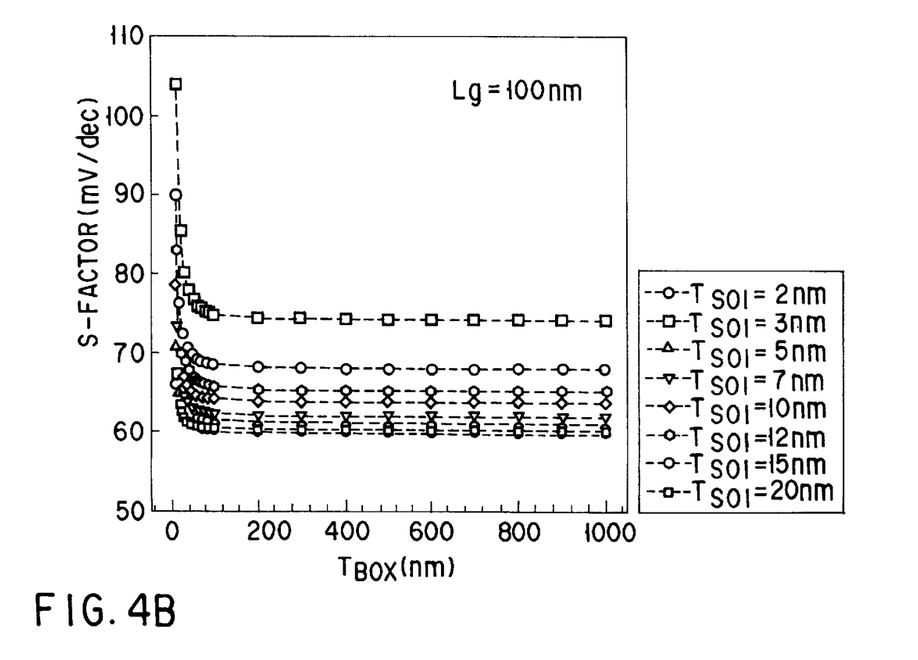

FIGS. 4A and 4B are graphs each showing a dependency characteristic of the S-factor on the thickness of the buried insulating layer, in which the thickness $T_{SOI}$ of the single-crystalline silicon layer, i.e., the active layer on the buried insulating layer, is used as a parameter. FIGS. 4A and 4B show results when the channel length Lg was set at 50 nm and 100 nm, respectively.

As shown in FIGS. 4A and 4B, where the thickness of the buried insulating layer becomes close to the channel length or more, the S-factor converges onto a certain value and does not change. In other words, where the buried insulating layer has a dielectric constant lower than that of silicon oxide, within a region from the channel side surface to a depth corresponding to the channel length, the S-factor is sufficiently made small.

The embodiments of the present invention that are made on the basis of these findings will be described hereinafter with reference to the accompanying drawings. In the following description, the constituent elements having substantially the same function and arrangement are denoted by the same reference numerals, and a repetitive description will be made only when necessary.

(First Embodiment)

Figure 1:
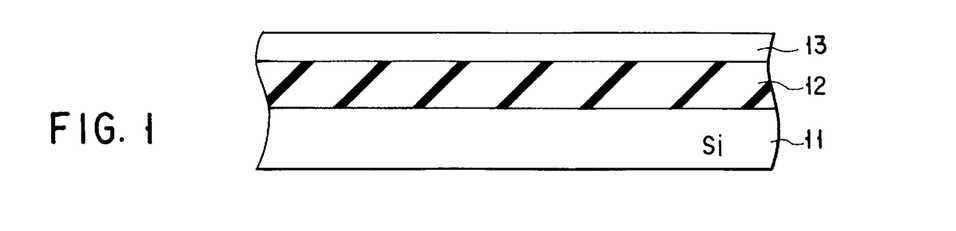
FIG. 1 is a cross-sectional view showing an SOI wafer according to a first embodiment of the present invention.
Figure 2:
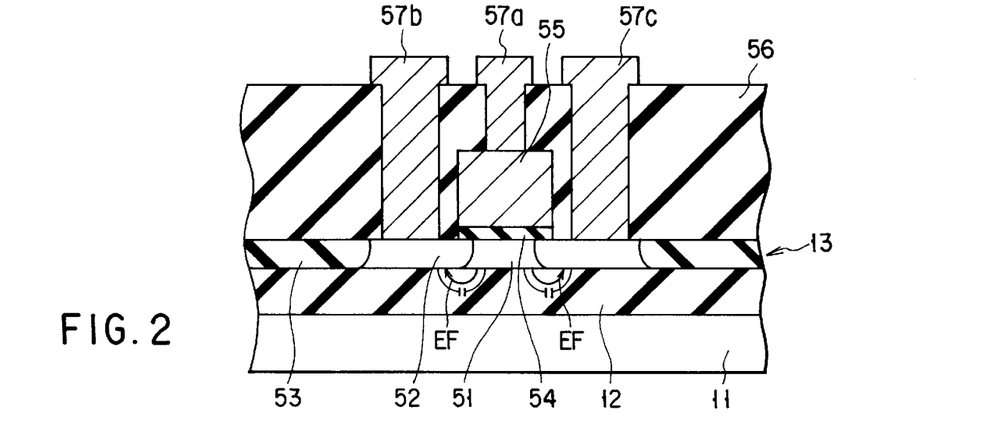
FIG. 2 is a cross-sectional view showing a semiconductor device including a field effect transistor according to the first embodiment of the present invention.

FIG. 1 is a cross-sectional view showing an SOI wafer according to a first embodiment of the present invention. FIG. 2 is a cross-sectional view showing a semiconductor device including a field effect transistor according to the first embodiment of the present invention.

As shown in FIG. 1, an active layer 13 of single-crystalline silicon is arranged on a support layer 11 of silicon through a buried insulating layer 12 consisting of a silicon oxide film doped with fluorine (SiOF film). The SiOF film 12 is a silicon oxide film containing fluorine at, e.g., about 12 atm %, and generally has a dielectric constant lower than that of a silicon oxide film doped with nothing.

Using the active layer, a channel region 51 and source/drain regions 52 of a field effect transistor, and a device isolation region 53 consisting of a insulating material are formed. A gate electrode 55 is arranged on the channel region 51 through a gate insulating film 54 consisting of a silicon oxide film. The active layer 13 is covered with a TEOS film 56, in which contact holes are formed to extend to the source/drain regions 52 and the gate electrode 55. The contact holes are filled with wiring layers 57a, 57b, and 57c which are in contact with the source/drain regions 52 and the gate electrode 55, respectively.

The SOI wafer shown in FIG. 1 and the semiconductor device shown in FIG. 2 are manufactured by the following methods, which will be explained with reference to FIGS. 5A to 7B.

Figure 5A:
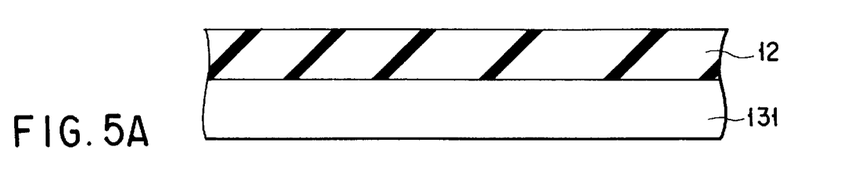
FIGS. 5A to 5C are cross-sectional views showing steps, in order, of manufacturing the SOI wafer shown in FIG. 1.

First, as shown in FIG. 5A, an SiOF film 12 containing fluorine at, e.g., about 12 atm %, and having a thickness of 500 nm is formed on a single-crystalline silicon substrate 131. For example, the SiOF film 12 is formed by a CVD method, using $SiH_4$ gas, $SiF_4$ gas, oxygen gas, and argon gas.

Figure 5B:
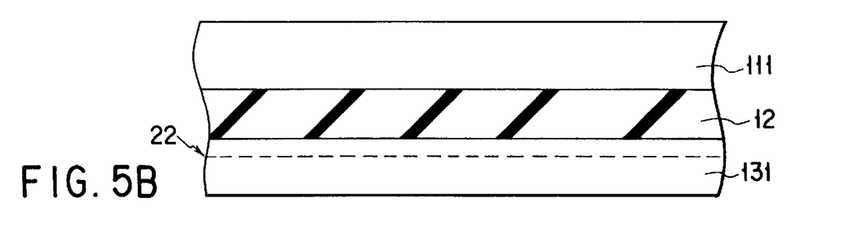

Then, as shown in FIG. 5B, for example, H ions 22 are implanted into the silicon substrate 131 at an acceleration voltage of about 65 keV and at a dose of about $5 \times 10^{16}$ $cm^{-2}$. Then, a single-crystalline silicon substrate 111 is bonded onto the SiOF film 12.

Figure 5C:
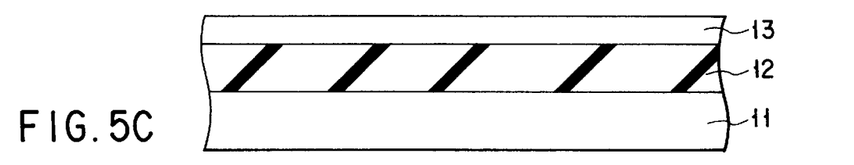

Then, as shown in FIG. 5C, the surface of the silicon substrate 131 is flattened by, e.g., a CMP method after a surface layer of the substrate 131 is removed, so that a single-crystalline silicon active layer 13 is formed. The silicon substrate 111 is used as a silicon support layer 11 as it is. When the surface layer of the silicon substrate 131 is removed, as described above, a method is utilized where part of the silicon substrate 131 is separated at a plane where H ions 22 has been implanted, by subjecting the substrate 131 to a heat treatment at 500° C. With the steps described above, the SOI wafer shown in FIG. 1 is completed.

Note that, a material other than the SiOF film, such as an SOG film, a silicon oxide film containing carbon, which is formed by using $Si(CH_3)_4$ gas and oxygen gas, or the like may be used as a buried insulating layer having a dielectric constant lower than that of silicon oxide.

An explanation will be given to a method of manufacturing the semiconductor device including a field effect transistor.

Figure 6A:
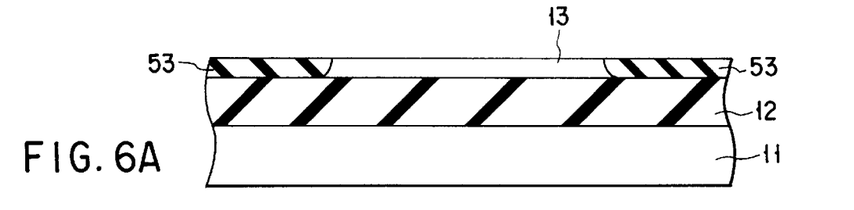
FIGS. 6A to 6C are cross-sectional views showing steps, in order, of manufacturing the semiconductor device shown in FIG. 2.

First, as shown in FIG. 6A, a device isolation region 53 is formed in the active layer 13 of the SOI wafer by selective oxidation, such as a LOCOS method.

Figure 6B:
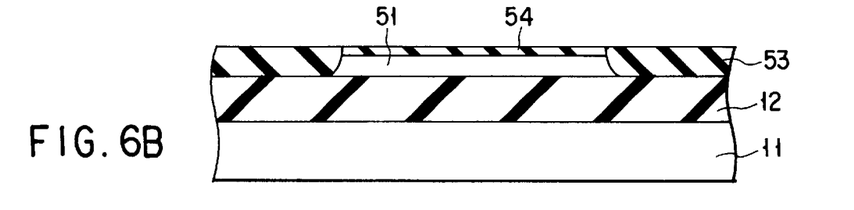

Then, as shown in FIG. 6B, for example, B ions are implanted into the active layer 13 at an acceleration voltage of about 40 keV and at a dose of about $1 \times 10^{13}$ $cm^{-2}$. Then, the surface of the active layer 13 is oxidized, for example, in a 10%-HCl-atmosphere at 800° C., so that a silicon oxide film 54 having a thickness of, e.g., 5 nm is formed.

Figure 6C:
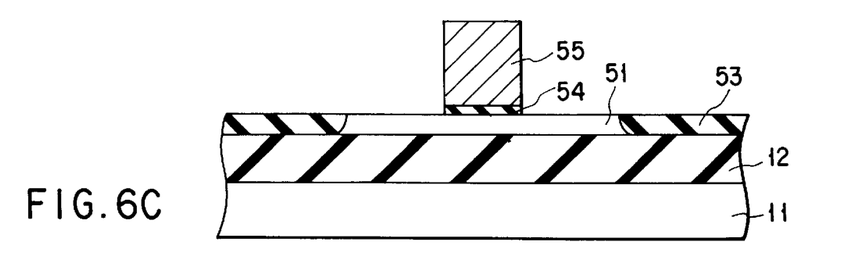

Then, as shown in FIG. 6C, a poly-crystalline silicon film having a thickness of, e.g., 200 nm is deposited on the silicon oxide film 54 by, e.g., an LPCVD method. Then, the poly-crystalline film is patterned, so that a gate electrode 55 is formed.

Figure 7A:
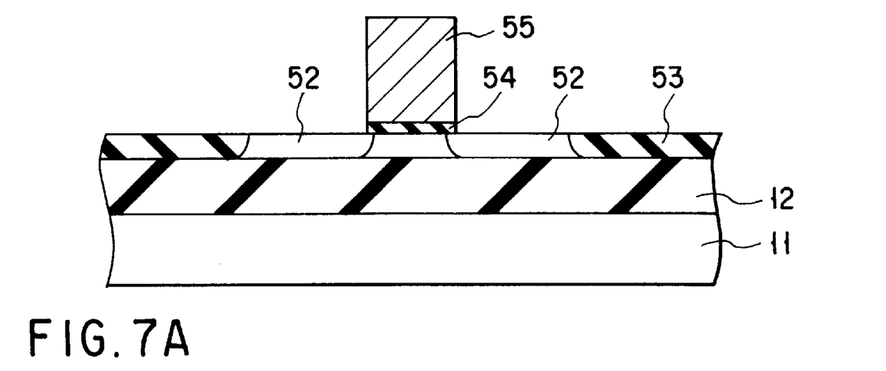
FIGS. 7A and 7B are cross-sectional views showing steps, in order, of manufacturing the semiconductor device shown in FIG. 2, following FIG. 6C.

Then, as shown in FIG. 7A, for example, As ions are implanted into the active layer 13 at an acceleration voltage of about 30 keV and at a dose of about $5 \times 10^{15}$ $cm^{-2}$, using the gate electrode as a mask. Then, source and drain regions 52 are formed by performing a heat treatment.

Figure 7B:
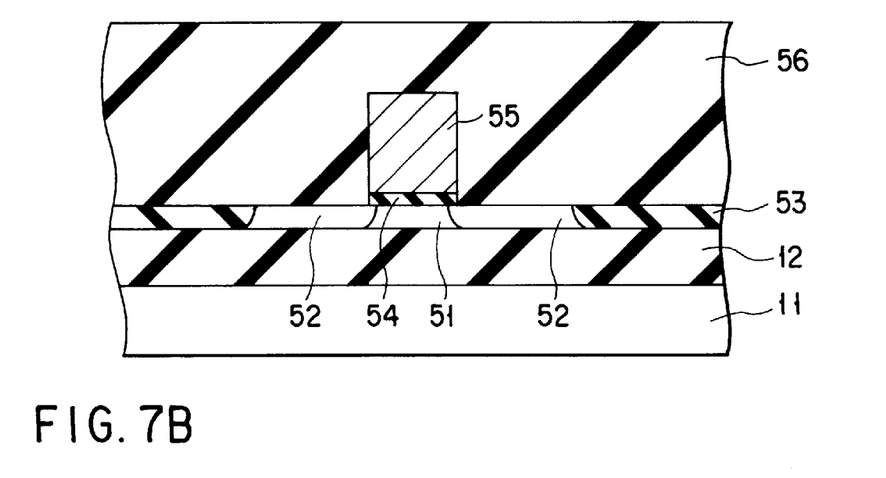

Then, as shown in FIG. 7B, for example, a TEOS (tetraethylorthosilicate) layer 56 is deposited by a CVD method, and the surface of the layer 56 is flattened. Then, contact holes are formed in the TEOS layer 56 and filled with wiring layers by means of a conventional method, so that the semiconductor device shown in FIG. 2 is completed.

In the semiconductor device according to this embodiment, the entirety of the buried insulating layer 12 is formed of a low-dielectric-constant region consisting of a material having a dielectric constant lower than that of silicon oxide. Consequently, the buried insulating layer 12 has a low-dielectric-constant region consisting of a material having a dielectric constant lower than that of silicon oxide, along the route of the lines of electric force EF extending from a channel region 51 to each of the source/drain regions 52 through the buried insulating layer 12 to form a capacitive coupling between the channel region 51 and each of the source/drain regions 52. With this arrangement, the S-factor is made small, thereby reducing the power consumption of the semiconductor device.

When the single-crystalline active layer 13 is formed, the silicon substrate 131 may not be supplied with the H ions implanted therein, but be directly flattened. The silicon substrate 111 bonded to the buried insulating layer 12 may be used as the single-crystalline active layer 13 by etching, while the silicon substrate 131 may be used as the support layer.

The single-crystalline layer may be formed by a melting and re-crystallizing method. In this case, a silicon film is formed by, e.g., an LPCVD method, and is then re-crystallized by a heat treatment, followed by flattening of the film.

In this embodiment, the device includes an n-type field effect transistor. If the conductivity types of impurities are reversed, a p-type field effect transistor can be formed with the same structure and advantage as those of this embodiment. Further, if the n-type and p-type transistors are combined, a field effect transistor device of the complementary type can be obtained. Besides, the field effect transistors may be formed as part of a semiconductor device including another active elemental device, such as a bipolar transistor, or another passive elemental device, such as a resistor or a capacitor.

In this embodiment, arsenic (As) is used as an impurity for forming an n-type semiconductor layer, while boron (B) is used as an impurity for forming a p-type semiconductor layer. Another element of group V and another element of group III may be used as impurities for forming n-type and p-type semiconductor layers, respectively. These impurities may be introduced as compounds.

In this embodiment, the impurities are introduced by ion-implantation. In place of the ion-implantation, for example, solid-phase diffusion or vapor-phase diffusion may be used to introduce the impurities. A method of depositing a semiconductor layer containing the impurities may be used to introduce the impurities.

In this embodiment, the transistor has a single drain structure. The present invention may be applied to a transistor of another type, such as one having an LDD structure. The present invention may also be applied to a device having a pocket structure or an elevated structure.

In this embodiment, although there is no mention about silicidation of the source/drain regions, they may be silicided. The source/drain regions and the gate electrode may be provided with metal thereon which is grown thereon or bonded thereto.

In this embodiment, the gate electrode is made of polycrystalline silicon. The gate electrode may be made of metal, metal silicide or there lamination, or the like. The gate electrode may be provide with an insulating layer thereon, such as a silicon oxide layer or a silicon nitride layer. The gate electrode may be subjected to a post-oxidation treatment.

In this embodiment, the gate insulating film is made of an oxide film formed by thermal oxidation. The present invention may be applied to a device employing a gate insulating film of another type, such as a nitride-oxide film, a lamination insulating film, a high dielectric constant film, or a ferroelectric film.

In this embodiment, the device isolation is performed by a LOCOS method. The device isolation may be performed by another method, such as a trench isolation method or a mesa isolation method.

(Second Embodiment)

Figure 8:
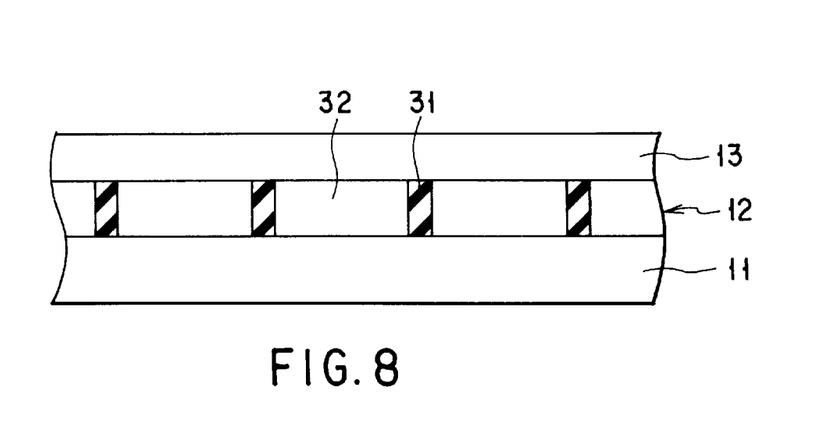
FIG. 8 is a cross-sectional view showing an SOI wafer according to a second embodiment of the present invention.
Figure 10A:
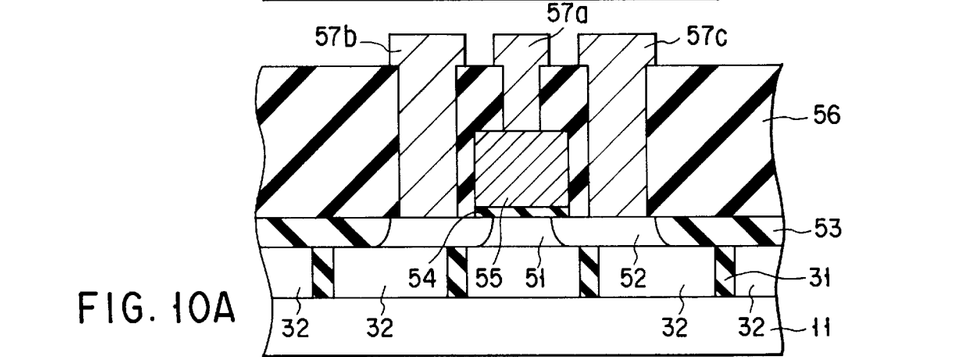
FIGS. 10A and 10B are cross-sectional views showing a semiconductor device including a field effect transistor, using the SOI wafer shown in FIG. 8, and a modification thereof, respectively.
Figure 10B:
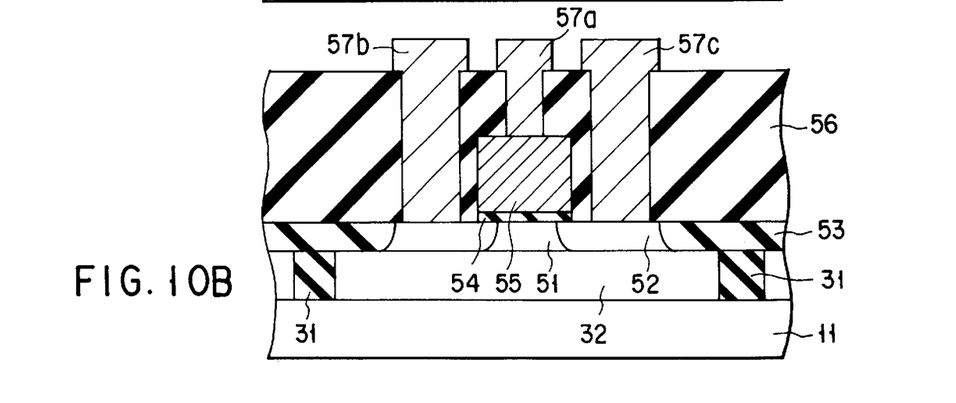

FIG. 8 is a cross-sectional view showing an SOI wafer according to a second embodiment of the present invention. FIGS. 10A and 10B are cross-sectional views showing a semiconductor device including a field effect transistor, using the SOI wafer shown in FIG. 8, and a modification thereof, respectively.

As shown in FIG. 8, an active layer 13 of single-crystalline silicon is arranged on a support layer 11 of silicon through a buried insulating layer 12. The buried insulating layer 12 has column like or wall like support portions 31 of silicon oxide and gap regions 32 containing a gas sealed therein.

The SOI wafer shown in FIG. 8 is manufactured by the following method, which will be explained with reference to FIGS. 9A to 9D.

Figure 9A:
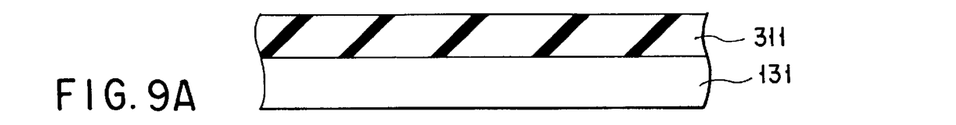
FIGS. 9A to 9D are cross-sectional views showing steps, in order, of manufacturing the SOI wafer shown in FIG. 8.

First, as shown in FIG. 9A, a silicon oxide film 311 having a thickness of 500 nm is formed on a single-crystalline silicon substrate 131 by, e.g., a thermal oxidation method.

Figure 9B:
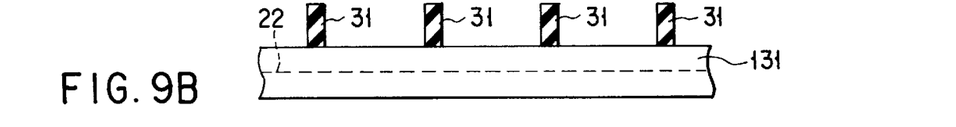

Then, as shown in FIG. 9B, for example, H ions 22 are implanted into the silicon substrate 131 as in the first embodiment. Then, part of the silicon oxide film 311 is selectively removed by, e.g., an RIE method, so that support portions 31 of silicon oxide are formed.

Figure 9C:
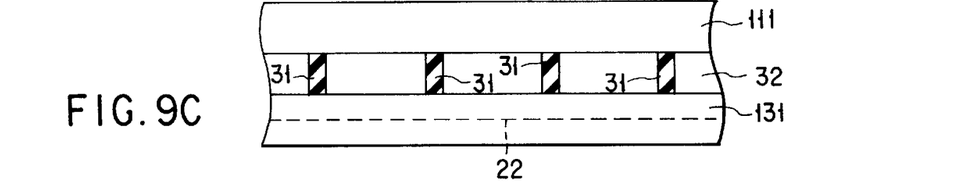

Then, as shown in FIG. 9C, a single-crystalline silicon substrate 111 is bonded onto the support portions 31 in an inactive or inert gas atmosphere or vacuum. At this time, gap regions 32 are formed between the substrates 111 and 131. It suffices that the thickness of the gap regions 32 is not less than the channel length of a field effect transistor described later.

Figure 9D:
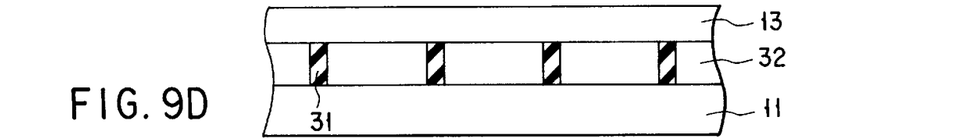

Then, as shown in FIG. 9D, the surface of the silicon substrate 131 is flattened after a surface layer of the substrate 131 is removed, so that a single-crystalline silicon active layer 13 is formed, as in the first embodiment. The silicon substrate 111 is used as a silicon support layer 11 as it is.

In this embodiment, the support portions 31 supporting the silicon active layer are made of silicon oxide. The support portions 31 may be made of another insulating material, such as silicon oxide doped with fluorine or carbon, SOG, or silicon nitride.

When the single-crystalline active layer 13 is formed, the silicon substrate 131 may not be supplied with the H ions implanted therein, but be directly flattened. The silicon substrate 111 may be used as the single-crystalline active layer 13 by etching, while the silicon substrate 131 may be used as the support layer.

FIG. 10A shows a semiconductor device including a field effect transistor, using the SOI wafer shown in FIG. 8. FIG. 10B shows a modified semiconductor device, in which the distance between the support portions 31 of the buried insulating layer 12 is widened, so that the entirety of the channel region 51, and the source/drain regions 52 are arranged on the gap region 32. The field effect transistor in each of FIGS. 10A and 10B can be manufactured by the same method as in the first embodiment, and thus no explanation will be given to the method.

In the semiconductor device according to this embodiment, the buried insulating layer 12 has the gap region 32 which is a vacuum or filled with an inactive or inert gas. The gap region 32 constitutes a low-dielectric-constant region having a dielectric constant of about one, which is far lower than that of silicon oxide. The gap region 32 is arranged along the route of the lines of electric force extending from a channel region 51 to each of the source/drain regions 52 through the buried insulating layer 12 to form a capacitive coupling between the channel region 51 and each of the source/drain regions 52. With this arrangement, the S-factor is made small, thereby reducing the power consumption of the semiconductor device.

(Third Embodiment)

This embodiment is an example where the second embodiment is applied to a semiconductor device including a field effect transistor, using a mesa type device isolation. This embodiment will be explained with reference to FIGS. 11A to 12C.

Figure 11A:
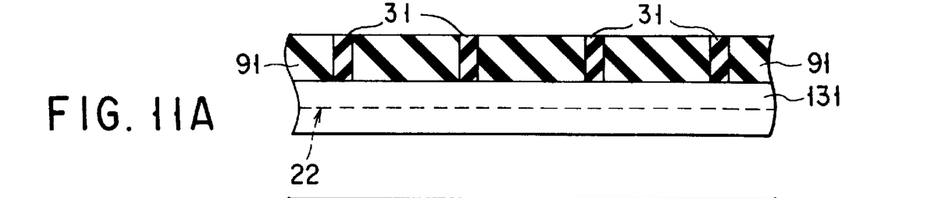
FIGS. 11A to 11C are cross-sectional views showing steps, in order, of manufacturing a semiconductor device including a field effect transistor according to a third embodiment of the present invention.

First, as shown in FIG. 11A, after the step shown in FIG. 9B of the second embodiment, a silicon nitride film 91 is deposited overall by, e.g., an LPCVD method. Then, the surface of the resultant structure is flattened.

Figure 11B:
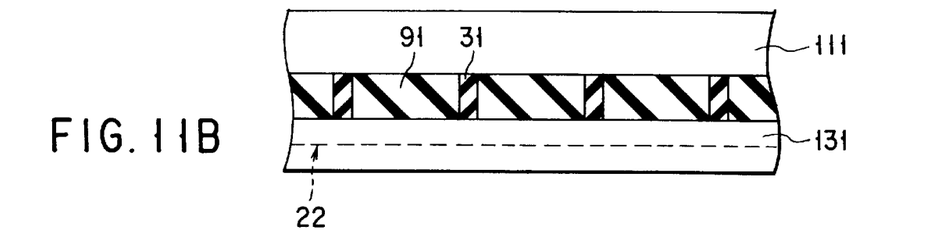

Then, as shown in FIG. 11B, a single-crystalline silicon substrate 111 is bonded onto the support portions 31 and the silicon nitride film 91.

Figure 11C:
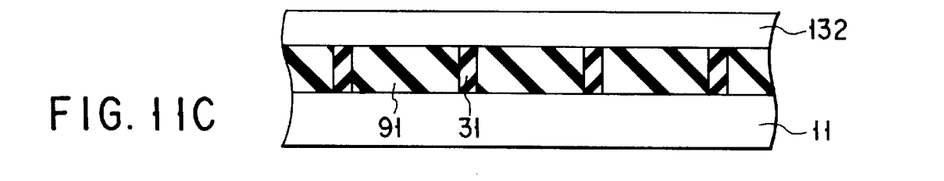

Then, as shown in FIG. 11C, the surface of the silicon substrate 131 is flattened after a surface layer of the substrate 131 is removed by a heat treatment at, e.g., 500° C., so that a single-crystalline silicon layer 132 is formed.

Figure 12A:
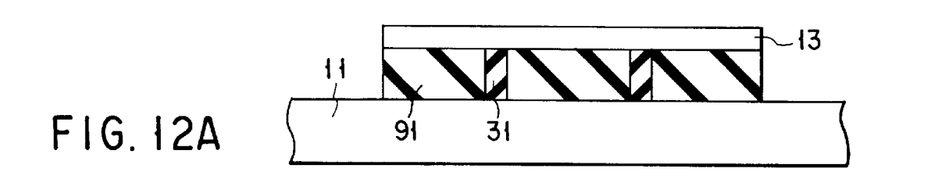
FIGS. 12A to 12C are cross-sectional views showing steps, in order, of manufacturing the semiconductor device according to the third embodiment, following FIG. 11C.

Then, the surface of the substrate is oxidized in an oxygen atmosphere at, e.g., 900° C., so that an oxide film (not shown) having a thickness of, e.g., 80 nm is formed. Then, the oxide film is removed to make the silicon layer thinner by a treatment using hydrofluoric acid, so that a single-crystalline silicon active layer 13 is formed, as shown in FIG. 12A. The silicon substrate 111 is used as a silicon support layer 11 as it is. Then, device isolation is performed by changing the device region to a mesa shape.

Figure 12B:
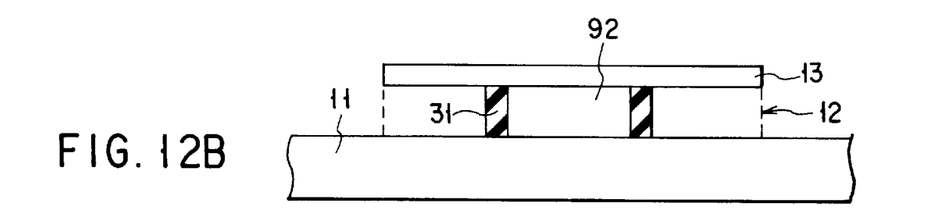

Then, as shown in FIG. 12B, the silicon nitride film 91 is removed by a treatment using, e.g., heated phosphoric acid. At this time, a gap region 92 is formed to be surrounded by the single-crystalline silicon active layer 13, the support portions 31, and the silicon support layer 11.

Figure 12C:
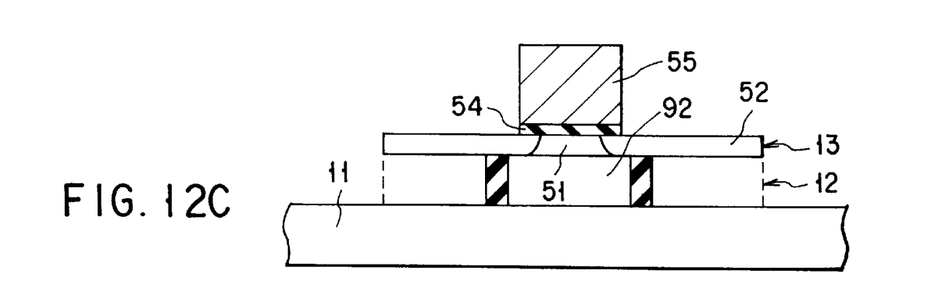

Then, as shown in FIG. 12C, a channel region 51, a gate insulating film 54, a gate electrode 55, and source/drain regions 52 are formed.

In this embodiment, the support portions 31 supporting the silicon active layer are made of silicon oxide. The support portions 31 may be made of another insulating material, such as silicon oxide doped with fluorine or carbon, SOG, or silicon nitride.

In this embodiment, the silicon nitride film 91 is used as a material for temporarily filing the gap region. For this purpose, it is possible to use another material, such as silicon oxide doped with fluorine or carbon, SOG, or carbon, as far as the material can be preferentially etched relative to the support portions 31 by selective etching.

When the single-crystalline active layer 13 is formed, the silicon substrate 131 may not be supplied with the H ions implanted therein, but be directly flattened. The silicon substrate 111 may be used as the single-crystalline active layer 13 by etching, while the silicon substrate 131 may be used as the support layer.

The single-crystalline layer may be formed by a melting and re-crystallizing method.

In this embodiment, the gap region is formed immediately after the device isolation. The gap region may be formed in a step later than that described in this embodiment, such as a step after the gate electrode is formed, or the source/drain regions are formed.

In the semiconductor device according to this embodiment, the buried insulating layer 12 has the gap region 92 which is a vacuum or filled with an inactive or inert gas. The gap region 92 is arranged along the route of the lines of electric force extending from a channel region 51 to each of the source/drain regions 52 through the buried insulating layer 12 to form a capacitive coupling between the channel region 51 and each of the source/drain regions 52. With this arrangement, the S-factor is made small, thereby reducing the power consumption of the semiconductor device.

(Fourth Embodiment)

Figure 13:
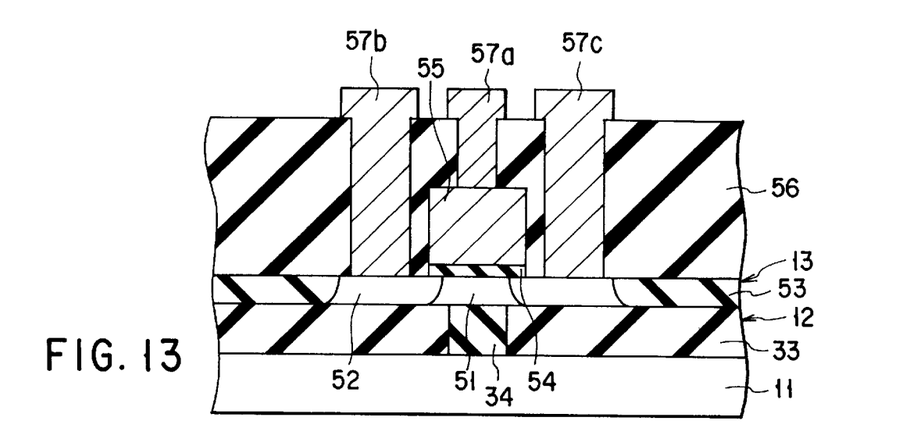
FIG. 13 is a cross-sectional view showing a semiconductor device including a field effect transistor according to a fourth embodiment of the present invention.

FIG. 13 is a cross-sectional view showing a semiconductor device including a field effect transistor according to a fourth embodiment of the present invention.

This embodiment is characterized in that an SOI wafer has a buried insulating layer 12 including different two solid portions 33 and 34. Specifically, a silicon oxide film (first insulating region) 34 is arranged directly under a channel region 51. A silicon oxide film doped with fluorine (SiOF film: second insulating region) 33 is arranged to extend from a position under the interface between the channel region 51 and each of source/drain regions 52 to a position under each of the source/drain regions 52.

In the aforementioned semiconductor device according to the first embodiment, the buried insulating layer 12 has a low dielectric constant overall. However, with a decrease in the dielectric constant of the buried insulating layer 12, the capacitive coupling between the channel region 51 and the support layer 11 is weakened, thereby bringing about a difficulty in keeping the potential of the channel region 51 by the support layer 11. In this case, a short channel effect becomes prominent, such that the potential of the channel region 51 is more influenced by the drain potential so as to lower the threshold voltage, with a decrease in the channel length.

Accordingly, where a semiconductor device has a very short channel length, it is not necessarily advantageous to reduce the dielectric constant of the buried insulating layer over the entirety of the layer. In such a semiconductor device with a very short channel length, it is preferable to weaken the capacitive coupling between the channel region 51 and each of the source/drain regions 52, while maintaining the capacitive coupling between the channel region 51 and the support layer 11 at a certain level.

The buried insulating layer 12 of the semiconductor device according to this embodiment has the first region 34 of silicon oxide, and the second region 33 having a dielectric constant lower than that of silicon oxide, in an arrangement shown in FIG. 13. The capacitive coupling between the channel region 51 and the support layer 11 is maintained by the first region 34 at a certain level to suppress the short channel effect. The capacitive coupling between the channel region 51 and each of the source/drain regions 52 is weakened by the second region 33 to make the S-factor smaller.

The semiconductor device shown in FIG. 13 is manufactured by the following methods, which will be explained with reference to FIGS. 14A to 15C.

Figure 14A:
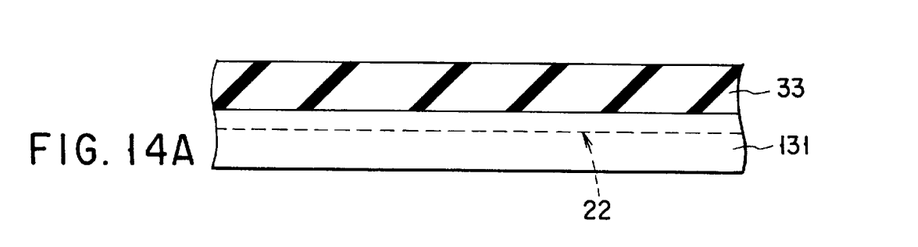
FIGS. 14A to 14C are cross-sectional views showing steps, in order, of manufacturing the semiconductor device shown in FIG. 13.

First, as shown in FIG. 14A, an SiOF film 33 containing fluorine at, e.g., about 12 atm %, and having a thickness of 500 nm is formed on a single-crystalline silicon substrate 131. For example, the SiOF film 33 is formed by a CVD method, using $SiH_4$ gas, $SiF_4$ gas, oxygen gas, and argon gas. Then, for example, H ions 22 are implanted into the silicon substrate 131 at an acceleration voltage of about 65 keV and at a dose of about $5 \times 10^{16}$ cm$^{-2}$.

Figure 14B:
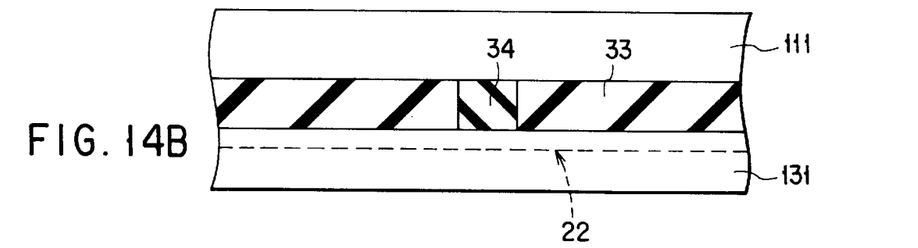

Then, as shown in FIG. 14B, that part of the SiOF film 33 which corresponds to the channel region 51 is selectively removed by an anisotropic etching, such as an RIE method. Then a silicon oxide film 34 is deposited overall, and flattened from its surface by, e.g., a CMP method, so that the silicon oxide film 34 is left only in the region where part of the SiOF film 33 has been removed. Then, a single-crystalline silicon substrate 111 is bonded onto the SiOF film 33 and the silicon oxide film 34. Note that the SiOF film 33 may not necessarily be etched to expose the silicon substrate 131.

Figure 14C:
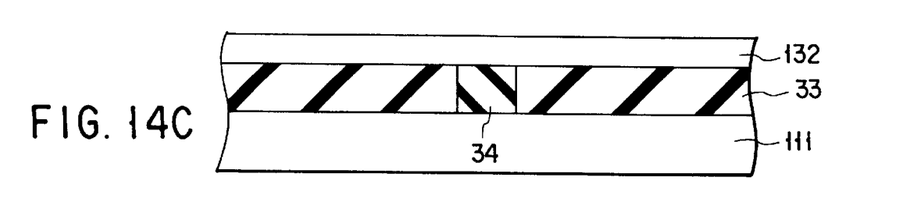

Then, as shown in FIG. 14C, a surface layer of the substrate 131 is removed by a heat treatment at, e.g., 500° C. Then, the surface of the silicon substrate 131 is flattened, so that a thin single-crystalline silicon layer 132 is formed.

Figure 15A:
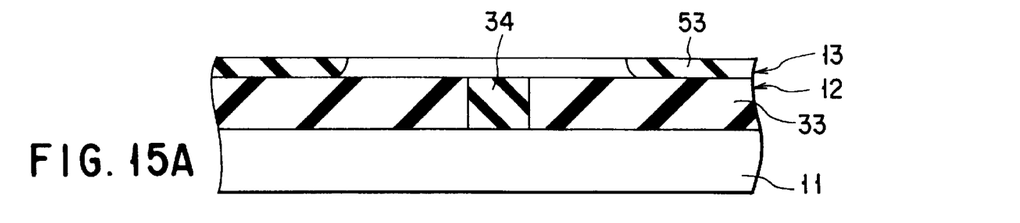
FIGS. 15A to 15C are cross-sectional views showing steps, in order, of manufacturing the semiconductor device shown in FIG. 13, following FIG. 14C.

Then, the surface of the substrate is oxidized in an oxygen atmosphere at, e.g., 900° C., so that an oxide film (not shown) having a thickness of, e.g., 80 nm is formed. Then, the oxide film is removed to make the silicon layer thinner by a treatment using hydrofluoric acid, so that a single-crystalline silicon active layer 13 is formed, as shown in FIG. 15A. The silicon substrate 111 is used as a silicon support layer 11 as it is. Then, a device isolation region 53 is formed in the active layer 13 by selective oxidation, such as a LOCOS method.

Figure 15B:
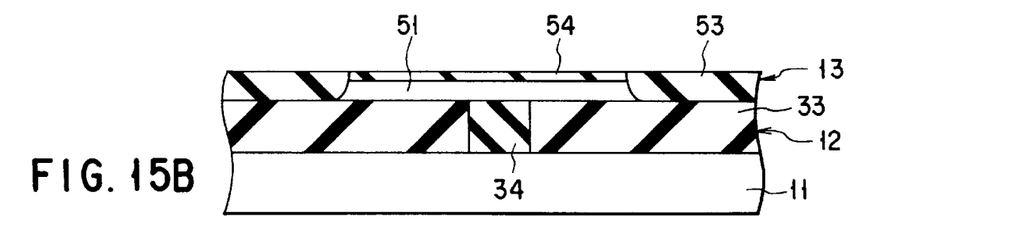

Then, as shown in FIG. 15B, a channel region 51 and a gate insulating film 54 are formed, as in the first embodiment.

Figure 15C:
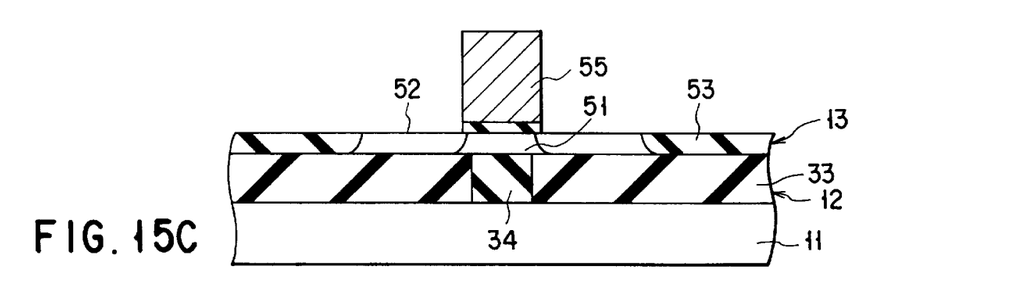

Then, as shown in FIG. 15C, a poly-crystalline silicon film having a thickness of, e.g., 200 nm is deposited overall by, e.g., an LPCVD method. Then, the poly-crystalline film is patterned, so that a gate electrode 55 is formed. Then, source/drain regions 52 are formed, using the gate electrode as a mask.

Then, the semiconductor device shown in FIG. 13 is completed through the sequential steps, as in the first embodiment.

In this embodiment, the region 33 arranged under the source/drain regions 52 is made of silicon oxide doped with fluorine. The region 33 may be made of another insulating material having a low dielectric constant, such as silicon oxide doped with carbon, or SOG.

When the single-crystalline active layer 13 is formed, the silicon substrate 131 may not be supplied with the H ions implanted therein, but be directly flattened. The silicon substrate 111 bonded to the buried insulating layer 12 may be used as the single-crystalline active layer 13 by etching, while the silicon substrate 131 may be used as the support layer.

The single-crystalline layer may be formed by a melting and re-crystallizing method.

(Fifth Embodiment)

Figure 16:
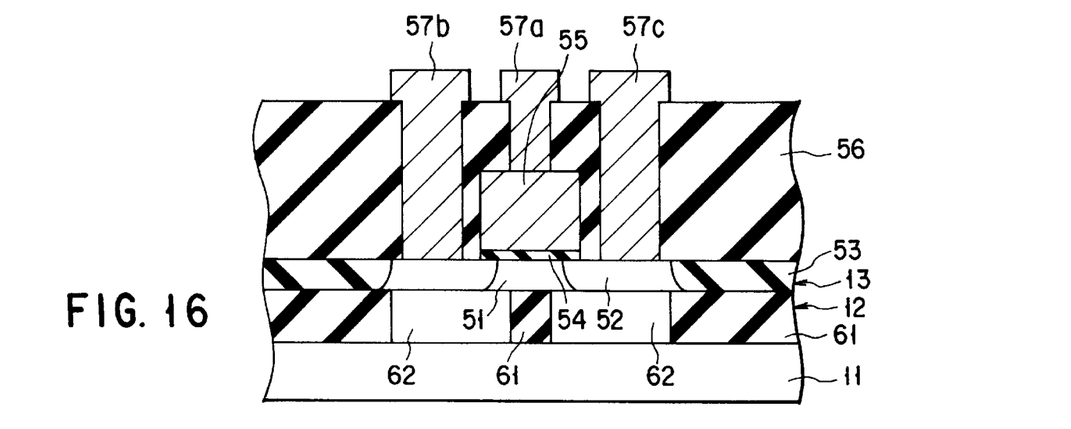
FIG. 16 is a cross-sectional view showing a semiconductor device including a field effect transistor according to a fifth embodiment of the present invention.

FIG. 16 is a cross-sectional view showing a semiconductor device including a field effect transistor according to a fifth embodiment of the present invention.

This embodiment is characterized in that an SOI wafer has a buried insulating layer 12 including a region 61 of silicon oxide and gap regions 62. Specifically, a region 61 of silicon oxide is arranged directly under a channel region 51. The gap region 62 is arranged to extend from a position under the interface between the channel region 51 and each of source/drain regions 52 to a position under each of the source/drain regions 52.

In the semiconductor device according to this embodiment, the capacitive coupling between the channel region 51 and a support layer 11 is maintained by the region 61 of silicon oxide at a certain level to suppress the short channel effect. The capacitive coupling between the channel region 51 and each of the source/drain regions 52 is weakened by the gap region 62 to make the S-factor smaller.

The semiconductor device shown in FIG. 16 is manufactured by the following method, which will be explained with reference to FIGS. 17A to 17D.

Figure 17A:
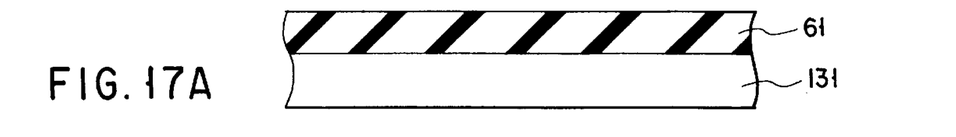
FIGS. 17A to 17D are cross-sectional views showing steps, in order, of manufacturing the semiconductor device shown in FIG. 16.

First, as shown in FIG. 17A, a silicon oxide film 61 having a thickness of, e.g., 500 nm is formed on a single-crystalline silicon substrate 131 by, e.g., a thermal oxidation method.

Figure 17B:
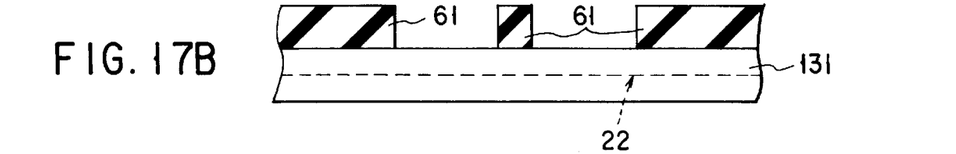

Then, as shown in FIG. 17B, for example, H ions 22 are implanted into the silicon substrate 131 at an acceleration voltage of about 65 keV and at a dose of about $5 \times 10^{16}$ cm$^{-2}$. Then, that part of the silicon oxide film 61 which corresponds to the source/drain regions 52 is selectively removed by, e.g., an RIE method, so that recesses are formed.

Figure 17C:
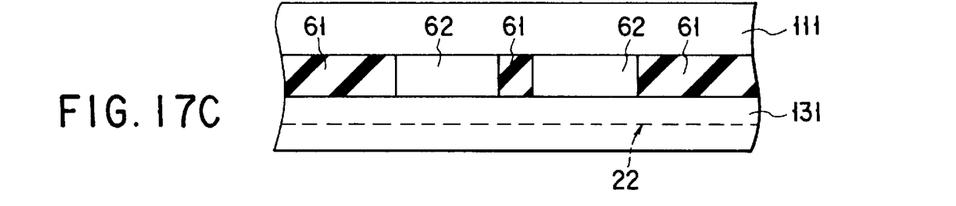

Then, as shown in FIG. 17C, a single-crystalline silicon substrate 111 is bonded onto the silicon oxide film 61 in an inactive or inert gas atmosphere or vacuum. At this time, gap regions 62 are formed to be surrounded by the silicon substrate 131, the silicon oxide film 61, and the silicon substrate 111.

Figure 17D:
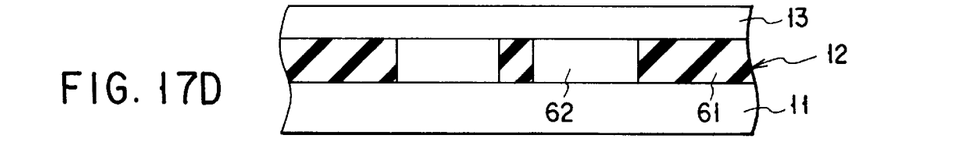

Then, as shown in FIG. 17D, the surface of the silicon substrate 131 is flattened after a surface layer of the substrate 131 is removed by a heat treatment at, e.g., 500° C., so that a single-crystalline silicon active layer 13 is formed. The silicon substrate 111 is used as a silicon support layer 11 as it is.

Then, a field effect transistor is formed through those steps of the fourth embodiment shown in FIG. 15A and thereafter, an explanation of which will be thus omitted.

When the single-crystalline active layer 13 is formed, the silicon substrate 131 may not be supplied with the H ions implanted therein, but be directly flattened. The silicon substrate 111 bonded to the buried insulating layer 12 may be used as the single-crystalline active layer 13 by etching, while the silicon substrate 131 may be used as the support layer.

(Sixth Embodiment)

This embodiment is an example where the fifth embodiment is applied to a semiconductor device including a field effect transistor, using a mesa type device isolation. This embodiment will be explained with reference to FIGS. 18A to 19C.

Figure 18A:
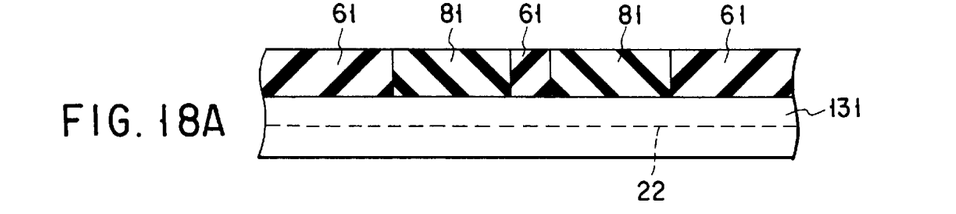
FIGS. 18A to 18C are cross-sectional views showing steps, in order, of manufacturing a semiconductor device including a field effect transistor according to a sixth embodiment of the present invention.

First, as shown in FIG. 18A, after the step shown in FIG. 17B of the fifth embodiment, a silicon nitride film 81 is deposited overall by, e.g., an LPCVD method. Then, the surface of the resultant structure is flattened.

Figure 18B:
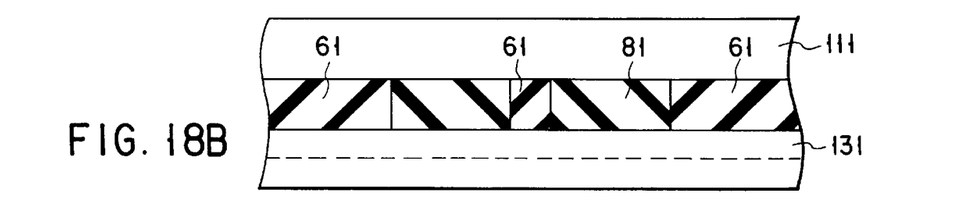

Then, as shown in FIG. 18B, a single-crystalline silicon substrate 111 is bonded onto the silicon oxide film 61 and the silicon nitride film 81.

Figure 18C:
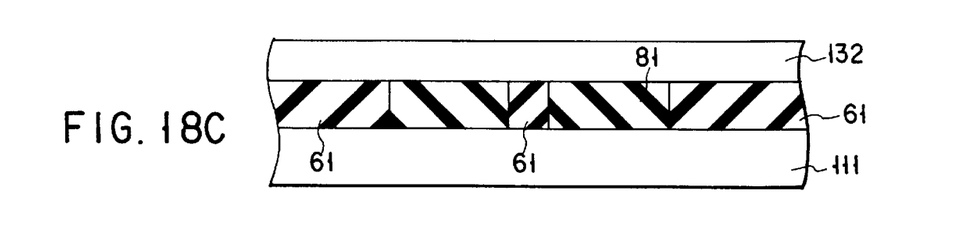

Then, as shown in FIG. 18C, the surface of the silicon substrate 131 is flattened after a surface layer of the substrate 131 is removed by a heat treatment at, e.g., 500° C., so that a single-crystalline silicon layer 132 is formed.

Figure 19A:
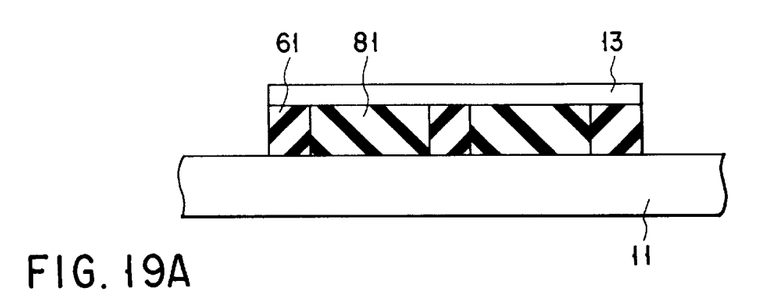
FIGS. 19A to 19C are cross-sectional views showing steps, in order, of manufacturing the semiconductor device according to the sixth embodiment, following FIG. 18C.

Then, the surface of the substrate is oxidized in an oxygen atmosphere at, e.g., 900° C., so that an oxide film (not shown) having a thickness of, e.g., 80 nm is formed. Then, the oxide film is removed to make the silicon layer thinner by a treatment using hydrofluoric acid, so that a single-crystalline silicon active layer 13 is formed, as shown in FIG. 19A. The silicon substrate 111 is used as a silicon support layer 11 as it is. Then, device isolation is performed by changing the device region to a mesa shape.

Figure 19B:
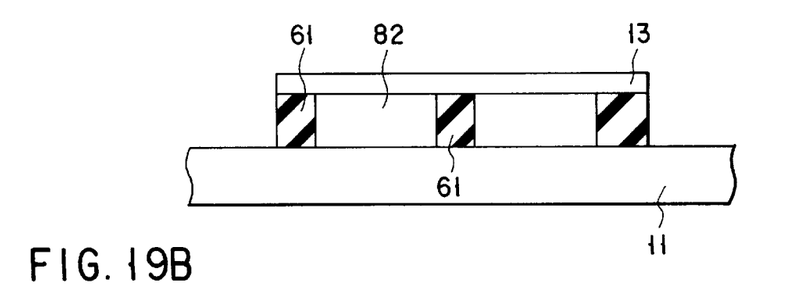

Then, as shown in FIG. 19B, the silicon nitride film 81 is removed by a treatment using, e.g., heated phosphoric acid.

At this time, a gap region 82 is formed to be surrounded by the single-crystalline silicon active layer 13, the silicon oxide layer 61, and the silicon support layer 11.

Figure 19C:
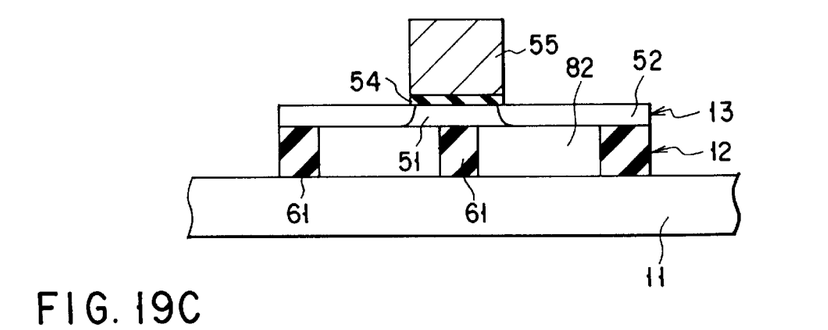

Then, as shown in FIG. 19C, a channel region 51, a gate insulating film 54, a gate electrode 55, and source/drain regions 52 are formed.

In this embodiment, the region 61 supporting the silicon active layer is made of silicon oxide. The region 61 may be made of another insulating material, such as silicon oxide doped with fluorine or carbon, SOG, or silicon nitride.

In this embodiment, the silicon nitride film 81 is used as a material for temporarily filing the gap region. For this purpose, it is possible to use another material, such as silicon oxide doped with fluorine or carbon, SOG, carbon, as far as the material can be preferentially etched relative to the silicon oxide film 61 by selective etching.

When the single-crystalline active layer 13 is formed, the silicon substrate 131 may not be supplied with the H ions implanted therein, but be directly flattened. The silicon substrate 111 may be used as the single-crystalline active layer 13 by etching, while the silicon substrate 131 may be used as the support layer.

The single-crystalline layer may be formed by a melting and re-crystallizing method.

In this embodiment, the gap region is formed immediately after the device isolation. The gap region may be formed in a step later than that described in this embodiment, such as a step after the gate electrode is formed, or the source/drain regions are formed.

In the semiconductor device according to this embodiment, similarly to the fifth embodiment, the capacitive coupling between the channel region 51 and the support layer 11 is maintained by the region 61 of silicon oxide at a certain level to suppress the short channel effect. The capacitive coupling between the channel region 51 and each of the source/drain regions 52 is weakened by the gap region 82 to make the S-factor smaller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device including a field effect transistor, comprising:
    a support layer consisting essentially of silicon;
    a buried insulating layer arranged on said support layer;
    an active layer consisting essentially of silicon and arranged on said buried insulating layer, said buried insulating layer being interposed between said support layer and said active layer;
    source/drain regions and a channel region interposed therebetween, which are formed in said active layer to be in contact with said buried insulating layer;
    a gate electrode facing said channel region through an insulating film; and
    source/drain electrodes connected to said source/drain regions, respectively,
    wherein said buried insulating layer comprises a low-dielectric-constant region having a dielectric constant of from 1 to 3.9, along a route of lines of electric force extending from said channel region to each of said source/drain regions through said buried insulating layer to form a capacitive coupling between said channel region and each of said source/drain regions.

2. The device according to claim 1, wherein said low-dielectric-constant region consists essentially of silicon oxide doped with fluorine at a concentration set to be more than zero and not more than 12 atm %.

3. The device according to claim 1, wherein said low-dielectric-constant region consists essentially of silicon oxide doped with carbon at a concentration set to be more than zero and not more than 2.9 times larger than a density of Si atoms in said low-dielectric-constant region.

4. The device according to claim 1, wherein said low-dielectric-constant region is formed of a gap region which is a vacuum or filled with an inactive gas.

5. The device according to claim 1, wherein said low-dielectric-constant region has a thickness between said support layer and said active layer, larger than a length of said channel region, between said source/drain regions.

6. The device according to claim 1, wherein said buried insulating layer further comprises a high-dielectric-constant region having a dielectric constant higher than that of said low-dielectric-constant region, and interposed between said support layer and said channel region.

7. The device according to claim 6, wherein said high-dielectric-constant region consists essentially of silicon oxide.

8. A semiconductor device including a field effect transistor, comprising:
    a support layer consisting essentially of silicon;
    a buried insulating layer arranged on said support layer and comprising a low-dielectric-constant region having a dielectric constant of from 1 to 3.9;
    an active layer consisting essentially of silicon and arranged on said buried insulating layer, said buried insulating layer being interposed between said support layer and said active layer;
    source/drain regions and a channel region interposed therebetween, which are formed in said active layer to be in contact with said buried insulating layer, said source/drain regions facing said low-dielectric-constant region;
    a gate electrode facing said channel region through an insulating film; and
    source/drain electrodes connected to said source/drain regions, respectively.

9. The device according to claim 8, wherein said channel region and each of said source/drain regions form a interface therebetween above said low-dielectric-constant region.

10. The device according to claim 9, wherein said low-dielectric-constant region is in contact with said support layer.

11. The device according to claim 10, wherein said channel region and said source/drain regions are in contact with said low-dielectric-constant region.

12. The device according to claim 11, wherein said low-dielectric-constant region occupies substantially all of said buried insulating layer.

13. The device according to claim 11, wherein said buried insulating layer further comprises a high-dielectric-constant region having a dielectric constant higher than that of said low-dielectric-constant region, and interposed between said support layer and said channel region.

14. The device according to claim 13, wherein said high-dielectric-constant region consists essentially of silicon oxide.

15. The device according to claim 8, wherein said low-dielectric-constant region has a thickness between said support layer and said active layer, larger than a length of said channel region, between said source/drain regions.

16. The device according to claim 8, wherein said gate electrode and said source/drain electrodes are arranged on a side of said active layer opposite to said buried insulating layer.

17. The device according to claim 8, wherein said low-dielectric-constant region consists essentially of silicon oxide doped with fluorine at a concentration set to be more than zero and not more than 12 atm %.

18. The device according to claim 8, wherein said low-dielectric-constant region consists essentially of silicon oxide doped with carbon at a concentration set to be more than zero and not more than 2.9 times larger than a density of Si atoms in said low-dielectric-constant region.

19. The device according to claim 8, wherein said low-dielectric-constant region is formed of a gap region which is a vacuum or filled with an inactive gas.

* * * * *